United States Patent
Couzijn

(10) Patent No.: US 8,446,306 B2
(45) Date of Patent: May 21, 2013

(54) METHOD FOR MIXING A COMPLEX DIGITAL SIGNAL WITH A REFERENCE SIGNAL, MIXER AND DIGITAL-TO-ANALOGUE CONVERTER USING THE METHOD

(75) Inventor: Wouter E. S. Couzijn, Prinsenbeek (NL)

(73) Assignee: Semiconductor Ideas to the Market (ITOM) B.V., Breda (NL)

( * ) Notice: Subject to any disclaimer, the term of this patent is extended or adjusted under 35 U.S.C. 154(b) by 67 days.

(21) Appl. No.: 13/259,144

(22) PCT Filed: Mar. 29, 2010

(86) PCT No.: PCT/EP2010/001967
§ 371 (c)(1),
(2), (4) Date: Sep. 22, 2011

(87) PCT Pub. No.: WO2010/112189
PCT Pub. Date: Oct. 7, 2010

(65) Prior Publication Data
US 2012/0013388 A1      Jan. 19, 2012

(30) Foreign Application Priority Data
Apr. 2, 2009   (EP) ..................................... 09004889

(51) Int. Cl.
*H03M 1/66* (2006.01)

(52) U.S. Cl.
USPC .......................... 341/144; 375/280; 375/308

(58) Field of Classification Search ... 341/144; 375/279, 375/280, 308
See application file for complete search history.

(56) References Cited

U.S. PATENT DOCUMENTS

| | | | |
|---|---|---|---|
| 5,844,943 A * | 12/1998 | Kazecki et al. | ............... 375/261 |
| 6,334,203 B1 * | 12/2001 | Inagawa | ........................ 714/798 |
| 6,621,438 B1 | 9/2003 | Hong | |
| 7,430,257 B1 | 9/2008 | Shattil | |
| 2003/0151533 A1 | 8/2003 | Khoini-Poorfard | |
| 2004/0056785 A1 * | 3/2004 | Webster et al. | .................. 341/61 |
| 2006/0291589 A1 * | 12/2006 | Eliezer et al. | ................. 375/302 |

\* cited by examiner

*Primary Examiner* — Howard Williams
(74) *Attorney, Agent, or Firm* — Robert M. McDermott

(57) ABSTRACT

Method and mixer using the method for mixing a complex digital input vector with an oscillator reference signal based on a separation of the mixing process in mainly two processing steps, to with a first step in which a set of n real part values $V_i$, is derived from said complex digital input vector in which n is an integer larger than 1 and in which each real part value $V_i$ is proportional to the real part of the digital input vector when being rotated over predetermined phase angles $\phi_i = \phi_0 + i*\Delta\phi$, respectively, for a constant $\phi_0$, $\Delta\phi$ corresponding to either $2\pi/n$ or $-2\pi/n$, with integer i varying between 0 and n−1 and a second step, in which said n real part values and $V_i$ are each consecutively selected to be coupled to a load.

10 Claims, 6 Drawing Sheets

METHOD FOR MIXING A COMPLEX DIGITAL SIGNAL WITH A REFERENCE SIGNAL, MIXER AND DIGITAL-TO-ANALOGUE CONVERTER USING THE METHOD

The invention relates to a method for mixing a complex digital signal with a reference signal, a mixer and a digital-to-analogue converter, hereinafter also referred to as mixer/DAC device or alternatively as mixing DAC converter, using the method.

Such mixing DAC converter is on itself known e.g. from US patent application 2008181336. This known mixing DAC converter includes a mixing digital-to-analog converter (DAC), a direct digital frequency synthesizer (DDFS), and a clock circuit. The known mixing DAC includes a radio frequency (RF) transconductance section receiving an RF signal and supplying an RF current signal to a switching section. The switching section includes inputs, receiving bits associated with a digital local oscillator (LO) signal, and an output. The switching section mixes the RF current signal with the digital LO signal to provide an analog output signal at the output of the switching section. The DDFS includes outputs providing the bits associated with the digital LO signal, and a first clock input, receiving a first clock signal that sets a sample rate for the digital LO signal. The clock circuit provides the first clock signal to the first clock input of the DDFS at a frequency that is based on a selected channel.

It is an object of the invention to provide a new method for mixing a digital input signal with a reference signal while simultaneously realizing a digital-to-analogue conversion, allowing for a reduction of the overall power consumption of a mixing digital-to-analog converter (DAC) architecture, which goes beyond the power reduction, which can be obtained with the above known mixing DAC converter.

Now, therefore, a method for mixing a complex digital input vector with an oscillator reference signal according to the invention is characterized by the following steps:

(i) deriving from said digital input vector a set of n real part values $V_i$ for integer n larger than 1, each real part value $V_i$ being proportional to the real part of the digital input vector rotated over predetermined phase angles $\phi_i = \phi_0 + i*\Delta\phi$, respectively, for a constant $\phi_0$, $\Delta\phi$ corresponding to either $2\pi/n$ or $-2\pi/n$, and with integer i varying between 0 and n−1;

(ii) within each cycle of the oscillator reference signal selecting consecutively each of said n real part values $V_i$ to be coupled to a load.

By applying the method according to the invention, the mixing process is divided into a generation of the discrete values of the digital input vector when being rotated over $2\pi$ at various phase angles followed by consecutively reading out these samples within the cycle frequency of the oscillator reference signal. This allows for a power efficiency optimization of each step, therewith increasing the overall power efficiency.

A preferred method according to the invention is characterized said real part values $V_i$ varying within each cycle between m discrete levels, each level being represented by an output current value of one of m analogue switched sources, and being switched through to said load during consecutive, mutually exclusive switching periods within each cycle of the oscillator reference signal.

A digital mixer for mixing a digital input vector with an oscillator reference signal according to the invention is characterized by a vector generator receiving through a signal input a complex digital input vector and deriving therefrom a set of n real part values $V_i$ for integer n larger than 1, each real part value $V_i$ being proportional to the real part of the digital input vector rotated over predetermined phase angles $\phi_i = \phi_0 + i*\Delta\phi$, respectively, for a constant $\phi_0$, $\Delta\phi$ corresponding to either $2\pi/n$ or $-2\pi/n$, and with integer i varying between 0 and n−1, said vector generator being coupled to a source selector for selecting within each cycle of the oscillator reference signal consecutively each of said n real part values $V_i$ and for coupling the selected real part value to a load.

The foregoing and other objects and advantages of the present invention will become more readily apparent from the following description of preferred embodiments, as taken in conjunction with the accompanying drawings, which are a part hereof and wherein.

Figure 9:
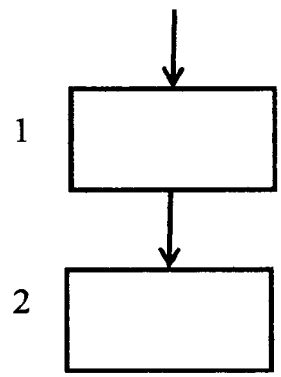
FIG. 9 is a flowchart of the method for mixing a complex digital input vector with an oscillator reference signal in accordance with the invention.

FIG. 9 provides in step 1 for the derivation from a complex digital input vector of a set of n real part values $V_i$ for integer n larger than 1, each real part value $V_i$ being proportional to the real part of the digital input vector rotated over predetermined phase angles $\phi_i = \phi_0 + i*\Delta\phi$, respectively, for a constant $\phi_0$, $\Delta\phi$ corresponding to either $2\pi/n$ or $-2\pi/n$, and with integer i varying between 0 and n−1. This derivation will be further clarified with reference to FIGS. 1 and 4.

Step 1 is followed by step 2, in which within each cycle of the oscillator reference signal each of said n real part values $V_i$ are being consecutively selected to be switched through to a load.

Figure 1:
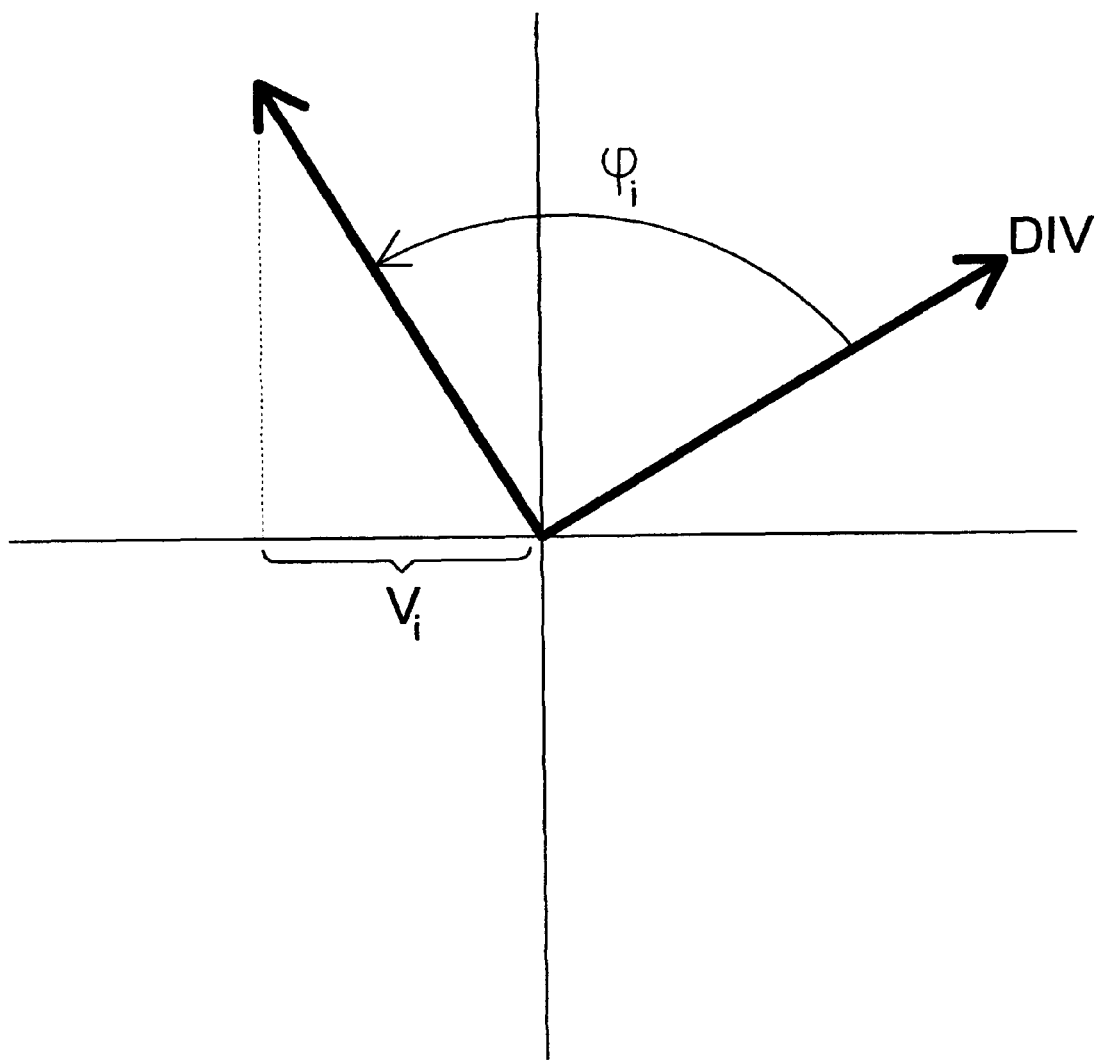
FIG. 1 shows a vector diagram clarifying the derivation of real part values as used in the method according to the invention.

In FIG. 1 a complex digital input vector DIV having a constant phase angle $\phi_0$ is being rotated over a predetermined phase angle $\Delta\phi = \pi/2$ to phase angle $\phi_1 = \phi_0 + \Delta\phi$. The real part of the digital input vector DIV is determined by the projection of this vector on the horizontal axis. In the vector diagram the real part of the vector DIV at phase angle $\phi_1$ is indicated with $V_i = V_1$. It will be clear that with a predetermined phase angle of $\pi/2$, 4 real part values will be obtained, varying between discrete levels $V_0$, $V_1$, $V_2$ and $V_3$, in which $V_1 = -V_3$ and $V_2 = -V_0$.

Figure 2:
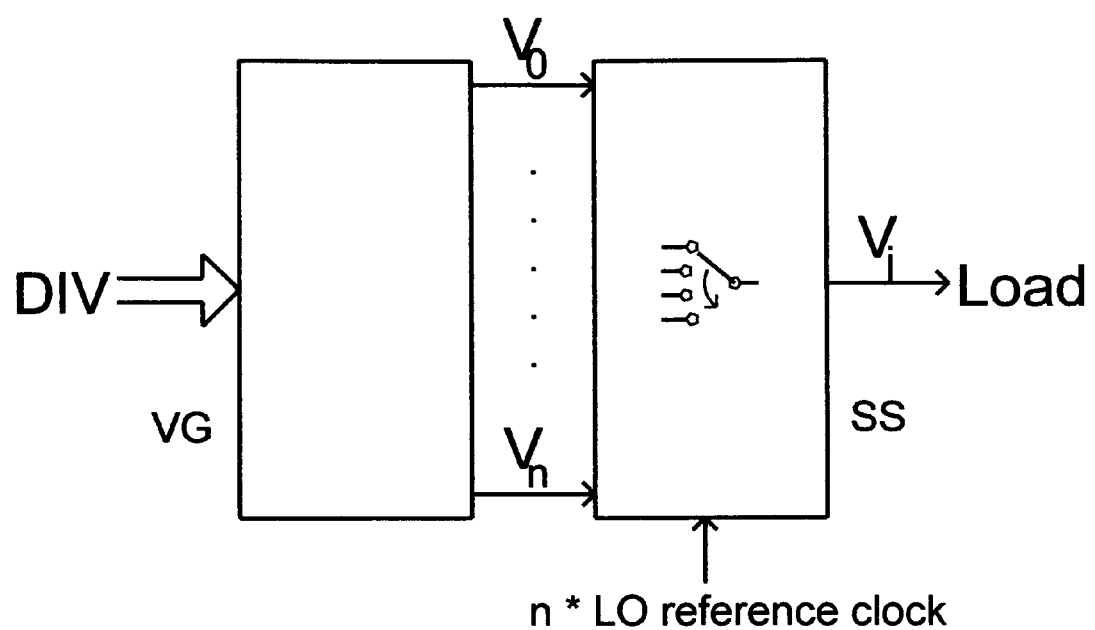
FIG. 2 shows the general principle of a mixer in accordance with the invention.

FIG. 2 shows an embodiment of an up-converting mixer according to the invention comprising a vector generator VG followed by a source selector SS. The vector generator VG receives a complex digital input vector DIV at a signal input and derives therefrom real part values $V_0$ to $V_{n-1}$ in accordance with the abovementioned method. Such derivation can be performed by using analogue or digital signal processing or a combination of analogue and digital signal processing. The real part values $V_0$ to $V_{n-1}$ can likewise be represented by n digital or n analogue (i.e. voltage or current) signals, hereinafter also referred to as "real part value signals", generated by n switched sources. These n real part value signals are supplied to n inputs of said source selector SS. A switch control signal is being supplied to a control input of a source selector SS. The switch control signal is used to control the switching operation of n switches to select within each cycle of the oscillator reference signal consecutively each of said n real part values $V_i$ which is to be coupled to a load.

The frequency of said switching operations amounts to n*LO reference clock, in which n represents the number of real part values $V_i$ and LO reference clock, the abovementioned oscillator reference signal. The source selector SS basically provides for a parallel to series conversion by which the n parallel real part values $V_i$ are converted in a continuous series of real part values $V_j$. This series of real part values $V_j$ or rather the abovementioned real part value signals representing those real part values $V_j$, is supplied to a load ANT to obtain an analogue output signal representing the upconverted input vector. In practise the load may be a transmitter antennae.

Dependent on the nature of the complex digital input vector, the invention not only provides for a highly efficient mixer, but may at the same time also function as a digital-to analogue converter and, dependent on the power of the switched sources and the strength of the real part value signals, at the same as a power amplifier as well.

In the embodiment shown, the complex digital input vector is e.g. a 1 MHz IF FM signal which is to be upconverted to 101 MHz using a 100 MHz oscillator reference signal.

Figure 3:
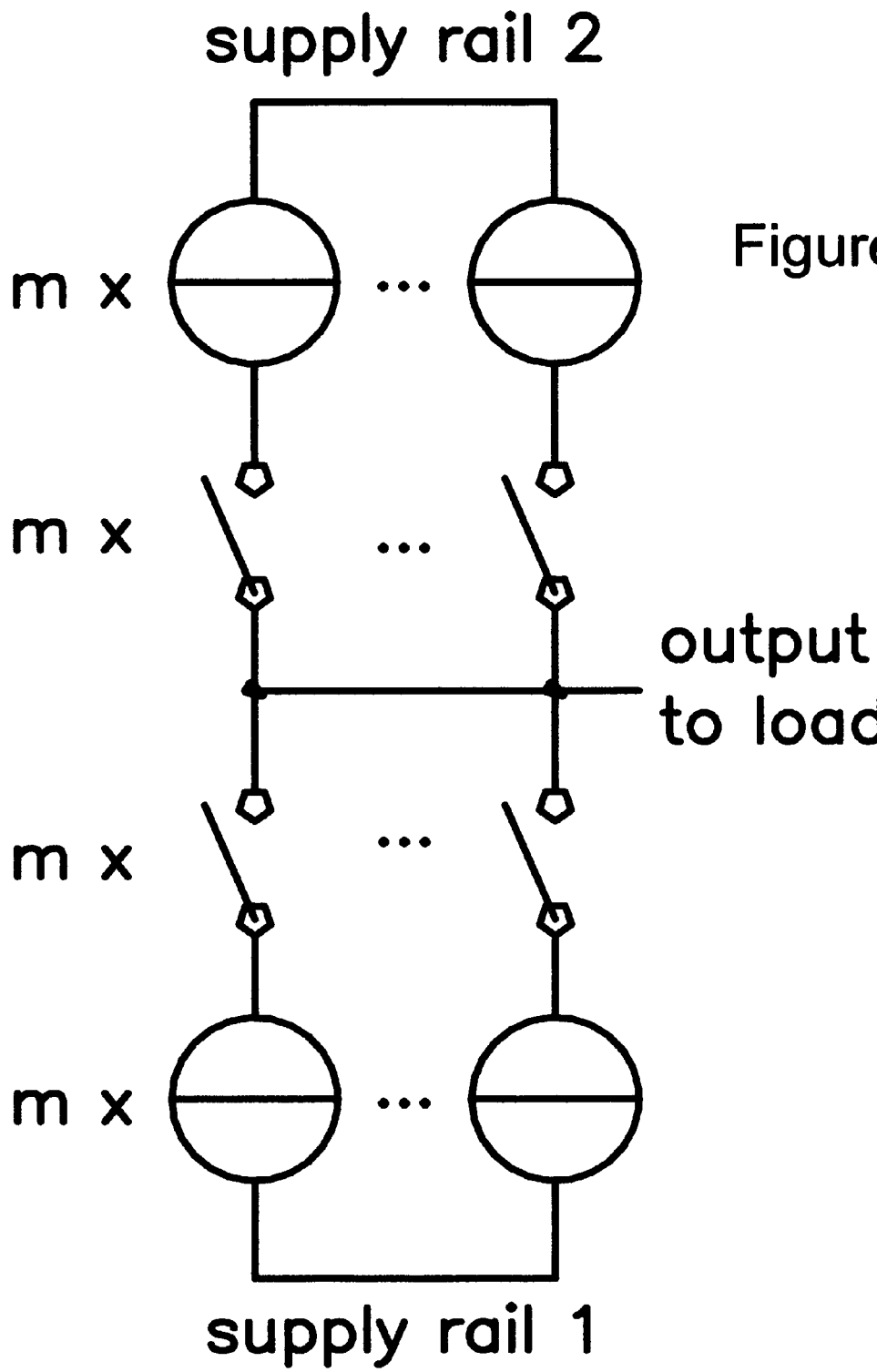
FIG. 3 shows a pair of mutually corresponding sets of m switched sources for use in the method according to the invention.

FIG. 3 shows an arrangement of a pair of mutually corresponding sets of m switched sources, one of said sets of switched sources, hereinafter also being referred to as "upper set", being arranged in a parallel array between a supply rail 2 providing a second supply voltage, e.g. a bias voltage, and the load, the other set of switched sources, hereinafter also being referred to as "lower set", being arranged in a parallel array between said load and a supply rail 1 providing a first supply voltage, e.g. ground. The load may be coupled to said supply rail 1 and may be a transmitter antennae. The arrangement as shown allows for the generation of each of all discrete levels of the n real part values $V_i$ occurring at the output of the source selector SS within each cycle of the oscillator reference signal. Because currents generated by the lower set of switched current sources are directed opposite to the currents generated by the upper set of switched current sources, the arrangement is functioning as a push pull endstage. By increasing the magnitudes of the switched current sources the gain of the endstage likewise increases, which allows to refrain from using a subsequent power amplifier or to reduce the gain requirements of such power amplifier. The mixer according to the invention therewith also functions as a power amplifier.

In obtaining the abovementioned discrete levels, the switching periods of the switched sources of the upper set and those of the lower set are prevented from mutually coinciding and are therewith mutually exclusive. By this measure the occurrence of currents partly or completely bypassing the load are avoided resulting in a significant improvement in power efficiency.

Figure 4:
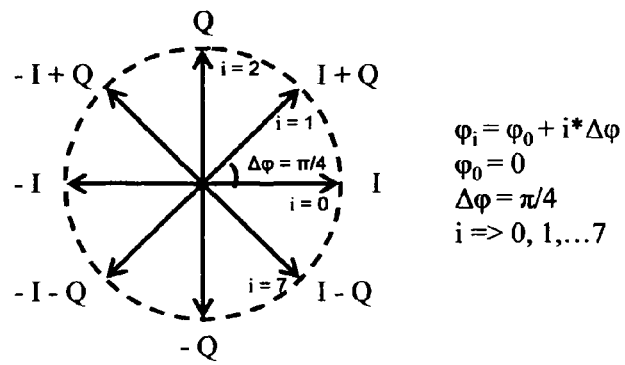
FIG. 4 shows in more detail a vector diagram clarifying the derivation of real part values as used in a specific embodiment of the invention.

FIG. 4 shows in more detail a vector diagram clarifying the derivation of real part values of a complex digital input vector as used in a specific embodiment of the invention for $\phi_i=\phi_0+i*\Delta\phi$, respectively, for a constant $\phi_0=0$, $\Delta\phi=\pi/4$ and with integer i varying between 0 and 7.

| $\Phi_i$, i= | (x, y) | f(I, Q) | I | Q | $V_i$ | I | Q | $V_i$ | I | Q | $V_i$ | I | Q | $V_i$ |
|---|---|---|---|---|---|---|---|---|---|---|---|---|---|---|
| 0 | (1, 0) | I | 0 | 0 | 0 | 1 | 0 | 1 | 0 | 1 | 0 | 1 | 1 | 1 |
| 1 | (½√2, ½√2) | ½√2(I + Q) | 0 | 0 | 0 | 1 | 0 | ½√2 | 0 | 1 | ½√2 | 1 | 1 | √2 |
| 2 | (0, 1) | Q | 0 | 0 | 0 | 1 | 0 | 0 | 0 | 1 | 1 | 1 | 1 | 1 |
| 3 | (−½√2, ½√2) | ½√2(−I + Q) | 0 | 0 | 0 | 1 | 0 | −½√2 | 0 | 1 | ½√2 | 1 | 1 | 0 |
| 4 | (−1, 0) | −I | 0 | 0 | 0 | 1 | 0 | −1 | 0 | 1 | 0 | 1 | 1 | −1 |
| 5 | (−½√2, −½√2) | −½√2(I + Q) | 0 | 0 | 0 | 1 | 0 | −½√2 | 0 | 1 | −½√2 | 1 | 1 | −√2 |
| 6 | (0, −1) | −Q | 0 | 0 | 0 | 1 | 0 | 0 | 0 | I | −1 | 1 | 1 | −1 |
| 7 | (½√2, −½√2) | ½√2(I − Q) | 0 | 0 | 0 | 1 | 0 | ½√2 | 0 | 1 | −½√2 | 1 | 1 | 0 |

The above table shows real part values $V_i$ representing the real part of the complex digital input vector DIV after stepwise being rotated in accordance with the vector diagram of FIG. 4 over $i*\pi/4$ for i=0, . . . 7. It is known that such real part value is identical to the projection of DIV on the X or real axis of a complex Cartesian coordinate system and can be calculated using the function: V=(I*x)+(Q*y).

Figure 5:
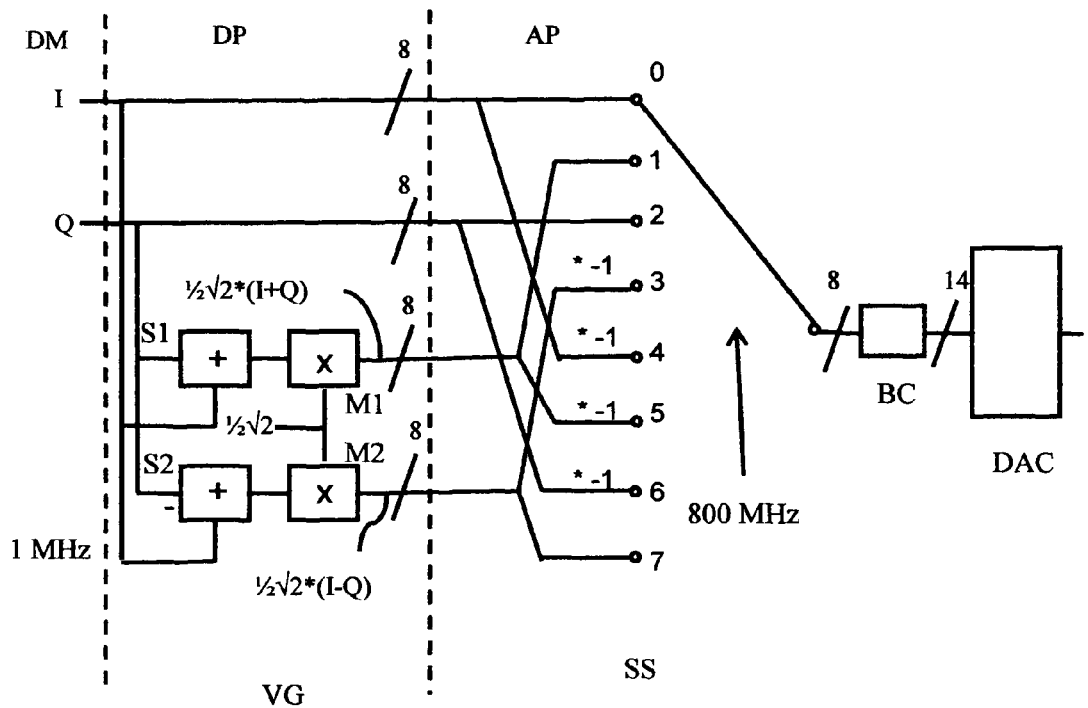
FIG. 5 shows an embodiment of a mixer/DAC device in accordance with the invention with a k to 2*m conversion after the selection of the real part value, that is to be coupled to the load.

The 8 real part values $V_i$ vary between 5 discrete levels −√2, −1, −½√2, 0, ½√2, 1, √2. FIG. 5 shows an embodiment of a mixer/DAC device corresponding to the one of FIG. 2 in which the vector generator VG and source selector SS are illustrated in more detail. The I,Q bits of a complex digital input vector DIV are respectively coupled as real part values $V_0$ and $V_2$ through the vector generator VG to switching terminals 0 and 2 of the source selector SS and after phase inversion respectively coupled as real part values $V_4$ and $V_6$ to switching terminals 4 and 6 of SS. The vector generator VG includes summing stages S1 and S2 each receiving the I and Q bits of the complex digital input vector DIV, however the Q bits are being phase inverted prior to arriving at said stage S2. Stage S1 therefore functions as an adder providing the sum of I and Q, whereas stage S2 is functioning as a differential stage providing the difference between I and Q. The output signals of S1 and S2 are weighted with weighing factor ½√2 in multipliers M1 and M2, respectively, to derive therefrom after an eventual phase inversion respective real part values $V_1$, $V_5$, $V_3$ and $V_7$. These values are respectively coupled to correspondingly numbered switching terminals 1, 5, 3 and 7 of the source selector SS. The signal processing steps carried out in the vector generator VG and more specifically in stages S1 and S2 as well as in the above weighing operations in M1 and M2 are carried out in a digital preprocessing step DP, i.e. digitally, requiring significantly less power than a corresponding signal processing in an analogue implementation.

A further advantage stems from the fact that the digital signal processing in the vector generator VG is performed at a frequency rate determined by the frequency of the complex digital input vector DIV, which is very low compared to the frequency of the local oscillator reference signal. In the embodiment shown, the frequency of the complex digital input vector DIV as provided by the digital modulator DM is typically 1 MHz, the frequency of the local oscillator reference signal being typically 100 MHz.

Figure 6:
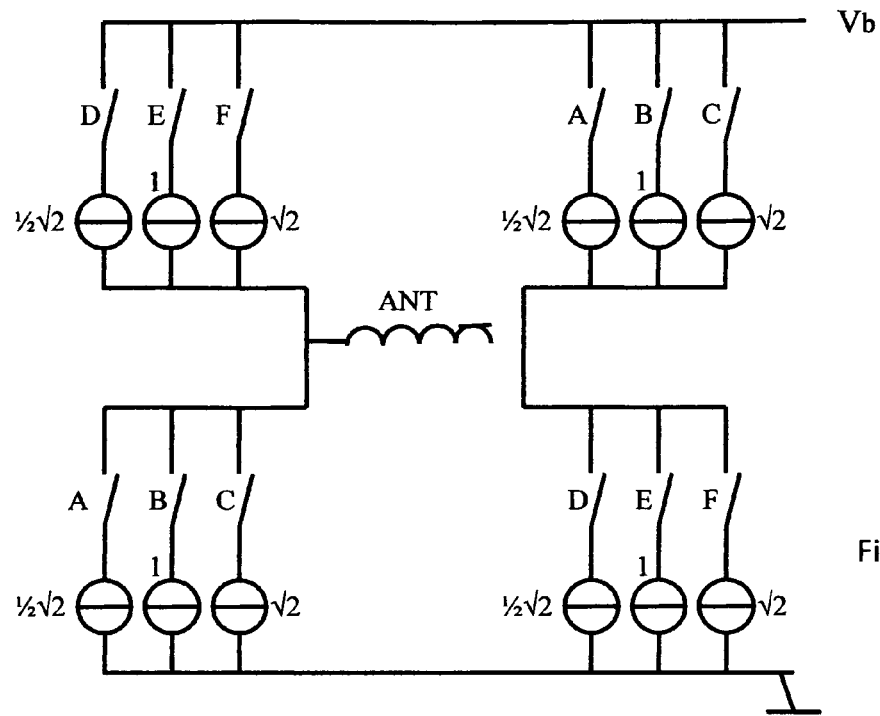
FIG. 6 shows an arrangement of analogue switched sources providing output currents varying with the level of the real part values referred to in FIGS. 1 and 4.

In an analogue processing step AP executed in the source selector SS preceding the selection operation, the real part values $V_0$-$V_7$ are each converted in a current signal in a switched source arrangement as shown in FIG. 6.

The switched current arrangement as shown in this FIG. 6 includes a first pair of mutually corresponding sets of 3 switched sources (A,B,C) and (D,E,F) providing output currents pairwise corresponding to the various magnitude levels of said real part values $V_i$, i.e. ½√2, 1, √2. Zero value is of course obtained by switching off all switching sources. The switched sources (D,E,F) of the one set are arranged in a parallel array between a bias voltage Vb and one end of a load ANT, the switched sources (A,B,C) of the other set are arranged in a parallel array between said one end of the load and ground. In the embodiment shown a second pair of mutually corresponding sets (A,B,C) and (D,E,F) is applied, in which the switched sources (D,E,F) of the one set are arranged in a parallel array between the other end of the load ANT and ground, whereas the bias voltage Vb and the other end of the load ANT. The switching actions of the respective switched current sources A, B and C of the first and the second pair of mutually corresponding sets occur simultaneously. The same holds for the switching actions of the respective switched current sources D, E and F of said first and the second pair of mutually corresponding sets. Currents originating from switched current sources A, B and C pass through the load ANT in a direction opposite to direction of currents originating from switched current sources D, E and F. If the currents from switched current sources A, B and C are defined to be positive, then the currents from switched current sources D, E and F are negative. This allows for a push pull supply of the load ANT and an efficient use of the available rail-to-rail voltage. By preventing the switching periods of the switched sources (A,B,C) to coincide with the switching periods of the switched sources (D,E,F) or put otherwise, by switching on the switched sources (A,B,C) on the one hand and the switched sources (A,B,C) on the other hand during consecutive, mutually exclusive switching periods within each cycle of the oscillator reference signal, all currents of said switching sources are being supplied to the load ANT without any power loss. This results in a significant increase in power efficiency compared with conventional mixers.

It is alternatively possible realize a push pull operation using only said first pair of mutually corresponding sets (A,B,C) and (D,E,F) without said second pair, or vice versa, by coupling the end of the load ANT opposite to the end connected to the switched sources, to ground.

Figure 7:
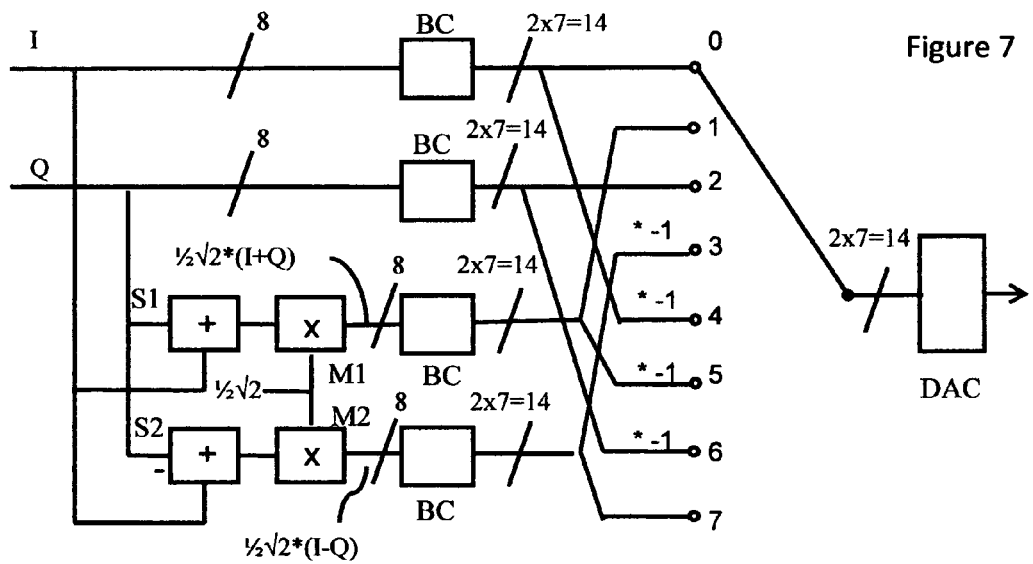
FIG. 7 shows an embodiment of a mixer/DAC device in accordance with the invention, in which a k to 2*m bit conversion of the k-bit wide word is performed on each of the n real part values $V_i$ preceding the selection of the real part value that is to be coupled to the load.

FIG. 7 corresponds to FIG. 5 except for the location of a k to 2*m bit converter BC. To clarify the purpose of this k to 2*m bit conversion reference is made to FIG. 8.

In practice, the complex digital input vector is k-bit wide, which means that this vector varies over $2^k$ different levels. A typical value for k is 8, which is applied in the embodiments shown in FIGS. 5 and 7. This is indicated with a slant line across the relevant signal path and the number 8 thereabove. To process such vector the vector generator VG and subsequent source selector SS as shown in these Figures are implemented in an 8 fold parallel arrangement. Each of said 8 bits is processed separately, in accordance with its binary significance. With 8 bits 256 different values or levels can be defined.

Figure 8:
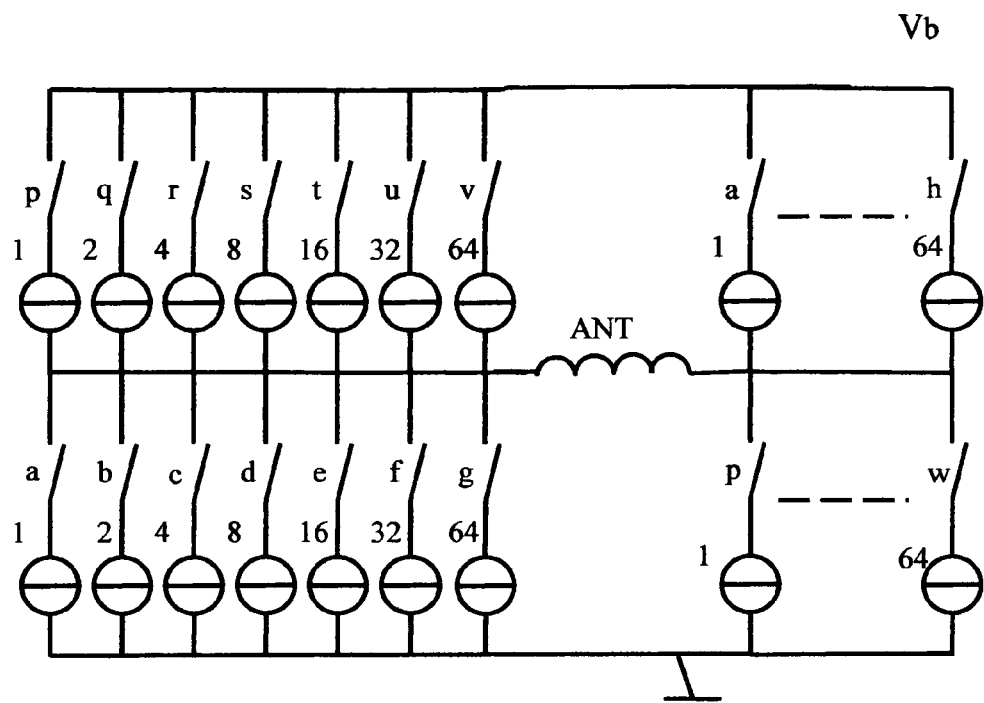
FIG. 8 shows an array of mutually corresponding sets of switched sources for use in a mixer/DAC device of FIGS. 5 and/or 7.

Turning now to FIG. 8 said 256 different values are separated into a group of 128 positive and a group of negative values. These values are generated by first and second pairs of mutually corresponding sets of 7 switched sources (a-g) and 7 switched sources (p-v) providing pairwise corresponding output currents with magnitudes increasing in binary exponential progression from 1 to 64. The embodiment of FIG. 8 uses the same principles with respect to the generation of the positive and negative values, the push pull operation and the consecutive, mutually exclusive switching periods of the switched sources as the one of FIG. 6, differing only in the number of discrete levels, that can be generated. The embodiment of FIG. 8 performs in combination of the vector generator VG and the source selector SS a DAC function shown in FIGS. 5 and 7 by a block with corresponding reference indication. The control of the switched sources a to g and the switched sources p to v, requires 2*7 different control signals or a 14 bit wide switching control signal. Or more generally, the structure of FIG. 8 with 2*m switched sources allows for a generation of $2*2^m$ mutually different discrete levels and require a 2*m bit wide switching control signal. This switching control signal is derived from the k bit wide complex digital input vector by using a k to 2*m bit converter. The realization of such converter belongs to the normal ability of the skilled person.

To simplify the control of the switching sources the control signal is preferably coded in a sign+magnitude bitsequence, which sign bit differs in function from the bits used to code the magnitude, in that it refers to the polarity of the value to be generated. The sign bit can be used to directly activate the correct set of switched sources for obtaining the wanted polarity.

In FIGS. 6 and 8 to 2*7 bit conversion is applied after the selection of the real part value, that is to be coupled to the load. However, the source selection increases the bitrate by a factor n, which in the embodiment shown amounts to 8. This means that the time period available to perform bit conversion 8 times smaller than prior to the source selector.

For that reason a k to 2*m bit conversion of the k-bit wide word is preferably performed on each of the n real part values $V_i$ receding the selection of the real part value that is to be coupled to the load as shown in FIG. 7.

In both cases the k to 2*m bit conversion increases the number of parallel signal processing arrangements from k to 2*m, or in FIGS. 5 and 7 from 7 to 14 and likewise decreases the bit processing rate.

The invention is embodied in each new characteristic and each combination of characteristics and is not limited to the embodiments explicitly disclosed. It may well be possible to make modifications to these embodiments without leaving the scope and spirit of the invention. For instance, the invention is not limited to the use thereof in mixing DACs for upconversion as shown in the above Figures, but may well be used in mixing DACs for downconversion, the terms bias voltage and ground include any suitable supply voltage, switched sources may include current and voltage sources. The term "real part values" in the descriptions of the Figures and the claims, may well be replaced by "imaginary part values" by a corresponding phase shift of the various predetermined phase angles of the digital input vector. Any reference signs do not limit the scope of the claims. The word "comprising" does not exclude the presence of other elements than those listed in a claim. Use of the word "a" or "an" preceding an element does not exclude the presence of a plurality of such elements.

The invention claimed is:

1. A method for mixing a complex digital input vector with an oscillator reference signal, comprising:
   deriving from the digital input vector a set of n real part values $V_i$, for integer n larger than 1, each real part value $V_i$ being proportional to the real part of the digital input vector rotated over predetermined phase angles $\phi_i=\phi_0+i*\Delta\phi$, respectively, for a constant $\phi_0$, $\Delta\phi$ corresponding to either $2\pi/n$ or $-2\pi/n$, and with integer i varying between 0 and n−1; and
   within each cycle of the oscillator reference signal, selecting consecutively each of the n real part values $V_i$ to be coupled to a load.

2. The method of claim 1, wherein the real part values $V_i$ vary within each cycle between m discrete levels, each level being represented by an output current value of one of m analogue switched sources, and are switched through to the load during consecutive, mutually exclusive switching periods within each cycle of the oscillator reference signal.

3. The method of claim 2, wherein a pair of mutually corresponding sets of m switched sources provide output currents pairwise corresponding to the magnitude of the real part values $V_i$ one of the sets of switched sources being arranged in a parallel array between a bias voltage and the load, the other set of switched sources being arranged in a parallel array between the load and ground, the switching periods of the switched sources of the one set and those of the other set being mutually exclusive.

4. The method of claim 3, in which the digital input vector includes a k-bit wide word defining $2^k$ values, the analogue representation of which is synthesized by the 2*m switched sources in pair of mutually corresponding sets of m switched sources, wherein these switches are controlled by a 2*m bit wide switch control signal derived from the k-bit wide word by a k to 2*m bit conversion.

5. The method of claim 4, wherein the k to 2*m bit conversion of the k-bit wide word is performed after the selection of the real part value that is to be coupled to the load.

6. The method of claim 4, wherein the k to 2*m bit conversion of the k-bit wide word is performed on each of the n real part values $V_i$ preceding the selection of the real part value that is to be coupled to the load.

7. The method of claim 1, wherein the k-bit wide digital input vector corresponds to a subset of a larger input vector of more than k bits.

8. The method of claim 1, wherein the k-bit wide digital input vector corresponds to a subset of a larger input vector of more than k bits.

9. A digital mixer for mixing a digital input vector with an oscillator reference signal, comprising:
   a vector generator that is configured to receive, through a signal input, a complex digital input vector and to derive therefrom a set of n real part values $V_i$ for integer n larger than 1, each real part value $V_i$ being proportional to the real part of the digital input vector rotated over predetermined phase angles $\phi_i=\phi_0+i*\Delta\phi$, respectively, for a constant $\phi_0$, $\Delta\phi$ corresponding to either $2\pi/n$ or $-2\pi/n$, and with integer i varying between 0 and n−1,
   and a source selector that is coupled to the vector generator and configured to select, within each cycle of the oscillator reference signal, consecutively each of the n real part values $V_i$ and to couple the selected real part value to a load.

10. The digital mixer of claim 9, wherein:
    the real part values $V_i$ vary within each cycle between m discrete levels,
    the vector generator includes an array of m switched sources providing output currents having values respectively corresponding to the m discrete levels,
    the source selector includes n switches that are controlled by the oscillator reference signal for selectively switching each of the n real part values $V_i$ to the load during consecutive, mutually exclusive switching periods within each cycle of the oscillator reference signal.

* * * * *